United States Patent
Quek et al.

(10) Patent No.: US 6,214,680 B1
(45) Date of Patent: Apr. 10, 2001

(54) METHOD TO FABRICATE A SUB-QUARTER-MICRON MOSFET WITH LIGHTLY DOPED SOURCE/DRAIN REGIONS

(75) Inventors: Shyue Fong Quek, Petaling Jaya (MY); Ting Cheong Ang, Singapore (SG); Puay Ink Ong, Kluang Johor (MY); Sang Yee Loong, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 09/460,111

(22) Filed: Dec. 13, 1999

(51) Int. Cl.[7] .................. H01L 21/336; H01L 21/76; H01L 21/425
(52) U.S. Cl. .................. 438/300; 438/197; 438/269; 438/424; 438/524
(58) Field of Search .................. 438/197, 424, 438/257, 269, 299, 300, 429, 517, 524, 682, 978

(56) References Cited

U.S. PATENT DOCUMENTS

| | | | |
|---|---|---|---|
| 3,996,657 | * 12/1976 | Simko et al. | 29/571 |
| 4,072,545 | * 2/1978 | De La Moneda | 148/187 |
| 4,331,708 | * 5/1982 | Hunter | 427/93 |
| 4,789,644 | * 12/1988 | Meda | 437/41 |
| 5,391,506 | 2/1995 | Tada et al. | 437/41 |
| 5,393,681 | 2/1995 | Witek et al. | 437/40 |
| 5,447,874 | 9/1995 | Grivna et al. | 437/40 |
| 5,624,863 | 4/1997 | Helm et al. | 438/210 |
| 5,856,251 | 1/1999 | Lee et al. | 438/291 |
| 6,090,691 | * 7/2000 | Ang et al. | 438/564 |
| 6,100,161 | * 8/2000 | Yu et al. | 438/424 |
| 6,110,787 | * 8/2000 | Chan et al. | 438/300 |

* cited by examiner

Primary Examiner—Matthew Smith
Assistant Examiner—Lex H. Malsawma
(74) Attorney, Agent, or Firm—George O. Saile; Rosemary L.S. Pike

(57) ABSTRACT

A new method of fabricating a MOSFET device is described. A semiconductor substrate is provided and isolation areas are formed isolating active areas in the substrate. An oxide layer is provided overlying both the substrate and isolation area and is patterned and etched to expose two areas within an isolated active area of the substrate. Selective epitaxial growth (SEG) using intrinsic silicon is performed to fill the exposed substrate areas formed in the previous etch step. The oxide layer region in the active area between the two epitaxially grown silicon regions is then etched, exposing the substrate. This is followed by a gate oxide growth and a polysilicon deposition. Planarization is then performed on the surface to expose the two epitaxially grown silicon regions. A second oxide is grown consuming some of the polysilicon gate and the epitaxially grown silicon. This consumption occurs at a higher rate at the upper surface and thus shapes the gate and epitaxially grown silicon into trapezoids with the base being wider than the top. The oxide is then etched leaving V-shaped trenches between the polysilicon and epitaxially grown silicon. A low-angle implantation is performed creating the source/drain extensions in the substrate below the V-shaped trenches. A third oxide is deposited filling the V-shaped groove and overlying the surface of the wafer. A second planarization is performed exposing the top of the epitaxially grown silicon regions and the polysilicon gate. A second implantation is performed to dope the polysilicon gate and epitaxially grown silicon regions. The doped portions of the epitaxially grown silicon form the source drain electrodes of the MOSFET. This is then followed by a salicidation step for metalization and annealing of the second implantation completing the MOSFET device.

29 Claims, 4 Drawing Sheets

METHOD TO FABRICATE A SUB-QUARTER-MICRON MOSFET WITH LIGHTLY DOPED SOURCE/DRAIN REGIONS

RELATED PATENT APPLICATION

U.S. patent application Ser. No. 09/435,437 (CS-99-052) to the same inventors, filed on Nov. 22, 1999.

BACKGROUND OF THE INVENTION (1) Field of the Invention

The invention relates to the method of fabrication of integrated circuit devices, and more particularly, to a method of forming a sub-quarter-micron MOSFET structure in the fabrication of integrated circuits.

(2) Description of the Prior Art

In sub-quarter-micron MOSFET architecture, it is necessary to use ultra-shallow source and drain extension regions. Low energy ion implantation is typically used to form such regions.

Figure 1:
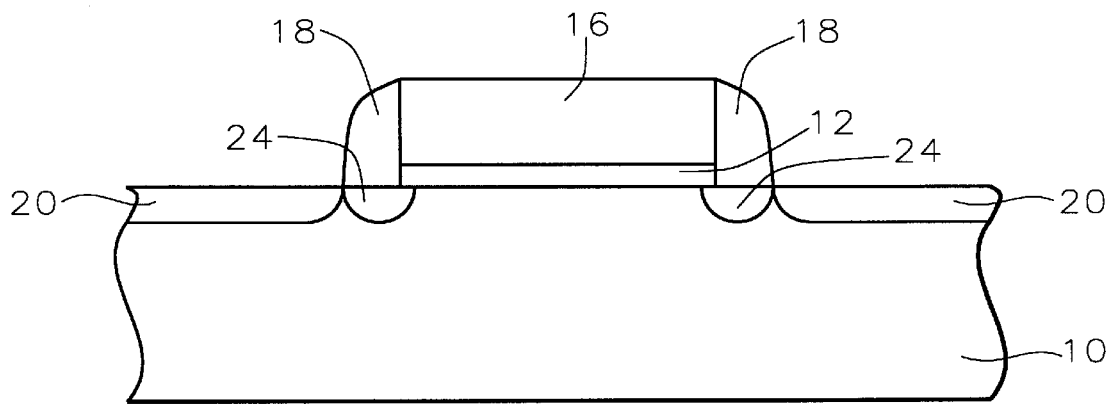

For example, FIG. 1 illustrates a semiconductor substrate 10, preferably composed of monocrystalline silicon. A layer of silicon oxide 12 is formed on the surface of the substrate. A polysilicon layer is deposited and patterned to form gate electrode 16. A typical LDD (lightly doped source and drain) structure 24 is formed by an LDD mask implant followed by deposition of the spacer oxide 18 and then a source/drain mask implant 20. Lightly doped source and drain regions 24 lie under the spacers 18 as shown in FIG. 1.

Gate critical dimension (CD) reproducibility has been a concern of all of the sub-micron technologies. Minimum gate length corresponds to the minimum feature size of any technology generation; that is, the edges of the lithography tool capability. Therefore, considerable relative variations of a gate CD are inevitable. At the same time, device characteristics strongly depend on the gate length.

U.S. Pat. No. 5,447,874 to Grivna et al teaches a method of forming a MOSFET device employing a dual metal gate formed in an oxide opening. Using a chemical mechanical polishing step to planarize the surface eliminates the problems encountered in etching different metals. U.S. Pat. No. 5,856,225 to Lee et al teaches a method of forming a MOSFET device where the source/drain regions are built prior to the implantation of the channel region under the gate. This allows more precise control of the source/drain positions, thereby controlling the electrical parameters of the MOSFET device. U.S. Pat. No. 5,393,681 to Witek et al teaches a method of forming a vertically raised transistor using selective epitaxial growth (SEG) to form the channel region of a MOSFET. U.S. Pat. No. 5,391,506 to Tada et al teaches a method for forming a transistor in a projection formed in the substrate. U.S. Pat. No. 5,624,863 to Helm et al teaches a method where the source and drain of a MOSFET are formed using out-diffusion from a doped silicon plug into the substrate.

SUMMARY OF THE INVENTION

A principal object of the present invention is to provide an effective and very manufacturable method of fabricating a MOSFET device having a raised source/drain structure.

Another object of the present invention is to provide a method of fabricating a MOSFET device having a raised source/drain structure using selective epitaxial growth (SEG).

Yet another object of the present invention is to provide a method of fabricating a sub-quarter-micron MOSFET device having a source and drain extension structure wherein the source/drain dopant concentrations are precisely controlled.

A further object of the present invention is to provide a method of fabricating a sub-quarter-micron MOSFET device wherein the particle implant damage to the gate oxide is minimized.

Yet another object of the present invention is to provide a method of fabricating a sub-quarter-micron MOSFET device wherein the contact spacing is wider. This allows use of a thicker metal salicide reducing the sheet resistance of the source, drain and gate regions. The wider spacing also reduces inter-electrode leakage.

A still further object of the present invention is to provide a method of fabricating a sub-quarter-micron MOSFET device having a flat surface topology allowing for better step coverage during subsequent processing.

In accordance with the objects of this invention, a new method of fabricating a sub-quarter micron MOSFET device is achieved. A semiconductor substrate is provided. Shallow-trench isolation (STI) regions, for example, are formed in this substrate. An oxide layer is provided overlying both the substrate and the STI regions. The oxide layer is patterned and etched exposing two regions of the substrate. A selective epitaxial growth (SEG) is performed with intrinsic silicon covering the two exposed substrate regions formed during the previous step. These intrinsic silicon regions will eventually form the source and drain regions of the MOSFET. The oxide layer region between the two epitaxially grown intrinsic regions is then patterned and etched away exposing the substrate between the two intrinsic silicon regions. This is followed by a gate oxide deposition and a gate polysilicon deposition. Chemical mechanical polishing (CMP) is then performed to expose the top surface of the intrinsic silicon regions. An oxidation step is then performed consuming some of the silicon in the polysilicon gate and intrinsic silicon regions. Since the oxide is formed on the upper surface, more of the silicon is consumed from the top surfaces of the polysilicon gate and intrinsic silicon regions. This forms each of the polysilicon gate and intrinsic silicon regions into a trapezoidal shape where both are thinner on the upper portions of the structure and wider on the lower section. An oxide etch is then performed removing most of the gate oxide along the sidewalls of the polysilicon gate leaving V-shaped trenches along the sidewalls of the poly-silicon gate. A low-angle ion implantation is performed forming source/drain extensions in the substrate area under the V-shaped trenches. An oxide is then deposited overlying the entire surface followed by a CMP planarization. A second implantation is performed to dope the two intrinsic silicon regions of the source/drain and polysilicon region. This is then followed by a salicidation step for metalization and annealing of the second implantation completing the MOSFET device.

BRIEF DESCRIPTION THE DRAWINGS

In the accompanying drawings forming a material part of this description, there is shown:

FIG. 1 schematically illustrates in cross-sectional representation a MOSFET having a LDD structure in accordance with prior art.

FIGS. 2 through 10 schematically illustrate in cross-sectional representation a preferred embodiment of the present invention.

DESCRIPTION OF THE PREFERRED EMBODIMENTS

Figure 2:
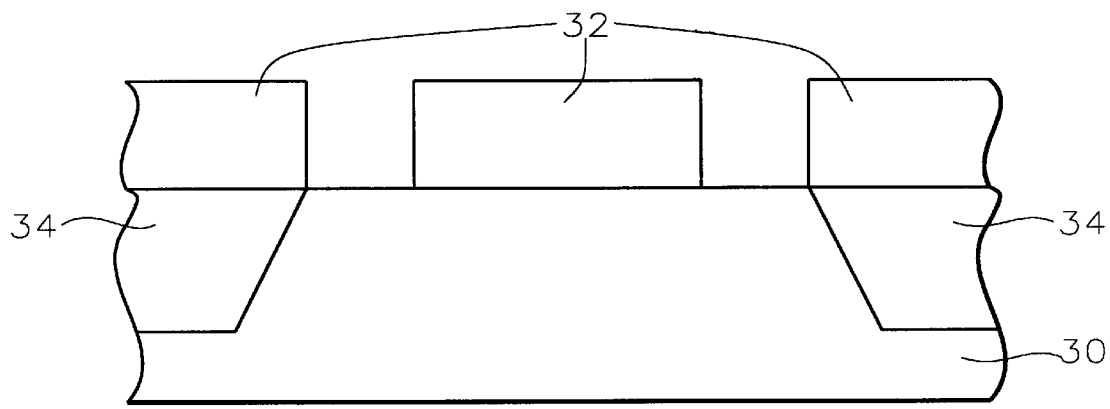
Figure 3:
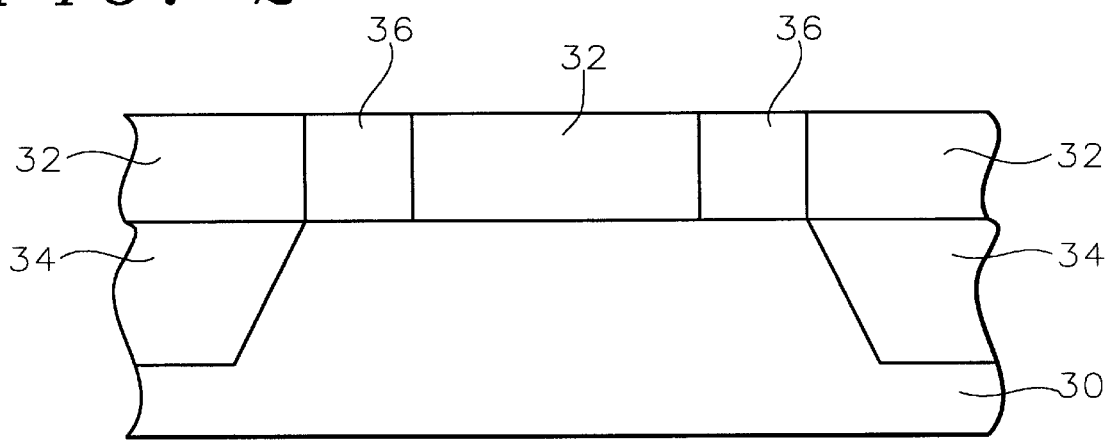

Without unduly limiting the scope of the invention, a preferred embodiment will be described herein. Referring now more particularly to FIG. 2, there is illustrated a portion of a partially completed MOSFET device. A semiconductor substrate 30 is provided preferably composed of monocrystalline silicon. Isolation regions such as shallow-trench isolation (STI) regions 34 are formed in the semiconductor substrate 30 to isolate active regions from one another. An oxide deposition or furnace oxide growth of thickness between about 1000 to 3000 Angstroms is performed. This oxide layer 32 may be comprised of any of a group containing Silicon Oxide, Silicon Nitride, Silicon Oxynitride, Aluminum Oxide, or Titanium Oxide. The oxide layer 32 is patterned to expose the surface of the substrate 30 in two areas of an active region Referring now to FIG. 3, two intrinsic silicon regions 36 are grown using selective epitaxial growth (SEG) on the areas of the substrate not covered by the oxide layer 32 to a thickness approximately equal to the thickness of the oxide layer 32.

Figure 4:
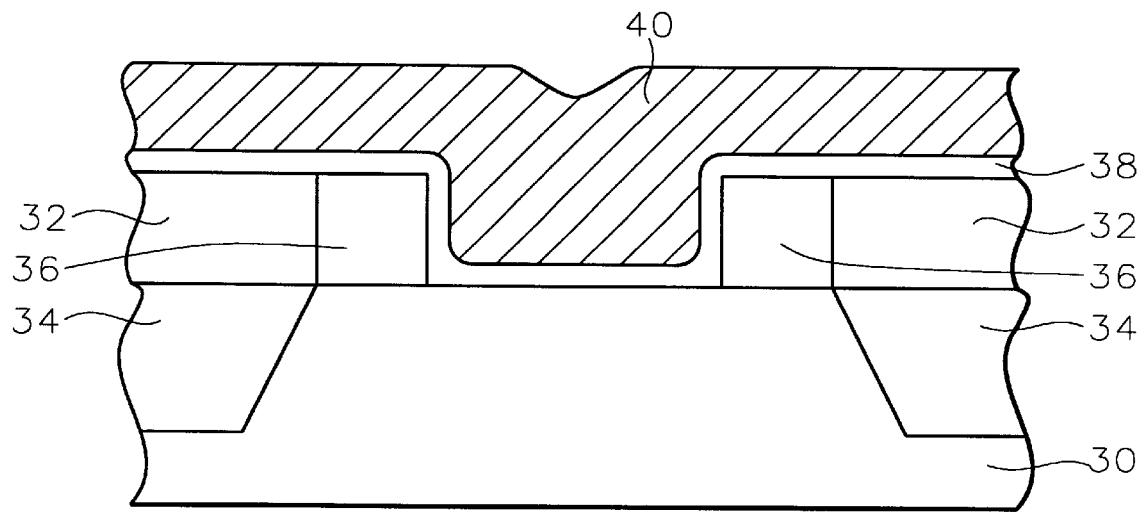

Referring now more particularly to FIG. 4, the area of oxide layer 32 between the two intrinsic silicon regions 36 is etched away. A gate oxide 38 is then conformally grown by rapid thermal oxidation (RTO), low pressure chemical vapor deposition (LPCVD) or furnace oxidation over the entire surface with a thickness of between about 10 to 200 Angstroms. This is followed by a deposition of a polysilicon gate layer 40 with a thickness of between about 1000 to 3000 Angstroms. This gate layer 40 may be composed of polysilicon, polysilicon germanium, amorphous silicon, platinum silicon germanium, or a stacked composite having one layer of polysilicon and a second layer of polysilicon germanium or a conducting metal such as tungsten, aluminum or titanium. When a stacked composite gate layer 40 is used, the deposition method is furnace oxide, chemical vapor deposition (CVD), low pressure CVD (LPCVD), or rapid thermal CVD (RTCVD). The first layer of the composite will have a thickness of between about 500 to 2000 Angstroms, and the second layer will have a thickness of between about 1000 to 2500 Angstroms.

Figure 5:
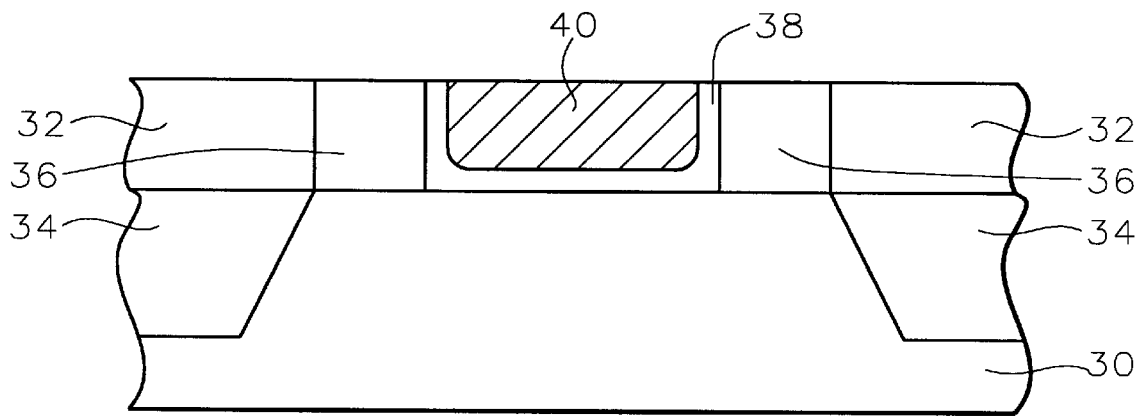

Referring now to FIG. 5, the surface is then planarized using chemical mechanical polishing (CMP), for example, leaving the gate oxide 38 and the polysilicon gate layer 40 only in the regions between the two intrinsic silicon regions 36. A wet oxide etch of the surface is then performed to treat the surface and open the top of the gate oxide 38.

Figure 6:
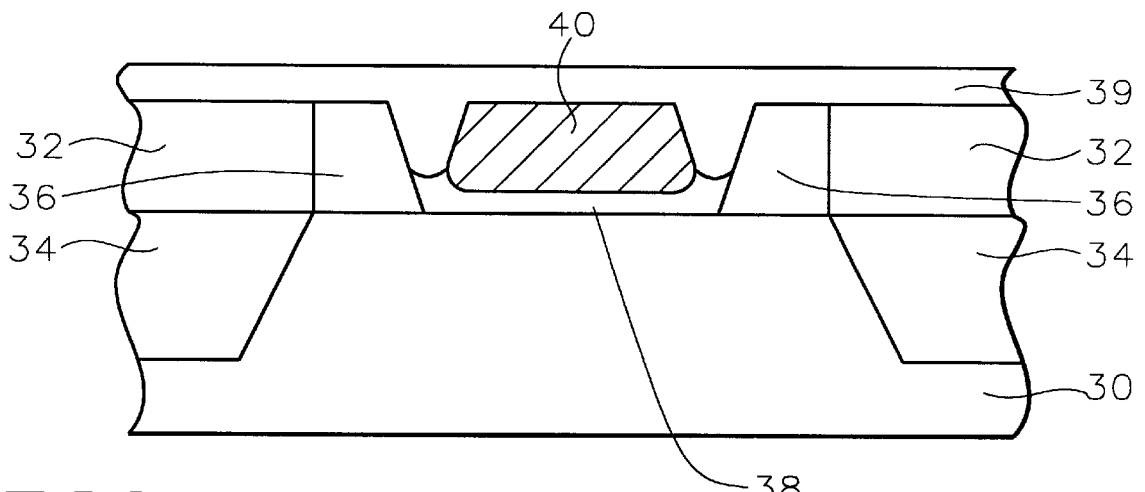

Referring now to FIG. 6, a second oxide layer 39 of thickness between about 400 to 1000 Angstroms is grown. During this process, the epitaxially grown intrinsic silicon 36 and polysilicon 40 are consumed. The consumption occurs at a higher rate near the upper surfaces of the intrinsic silicon 36 and polysilicon 40. This results in a polysilicon gate and intrinsic silicon regions that are trapezoidal in shape where these structures are thinner on the upper portions of the structure and wider on the lower section. A dry oxidation performed for 3 to 120 minutes at 800° C. to 1000° C. is preferred. A wet oxidation may be used under the same temperature conditions, but this could occur too quickly to achieve the desired gate shape.

Figure 7:
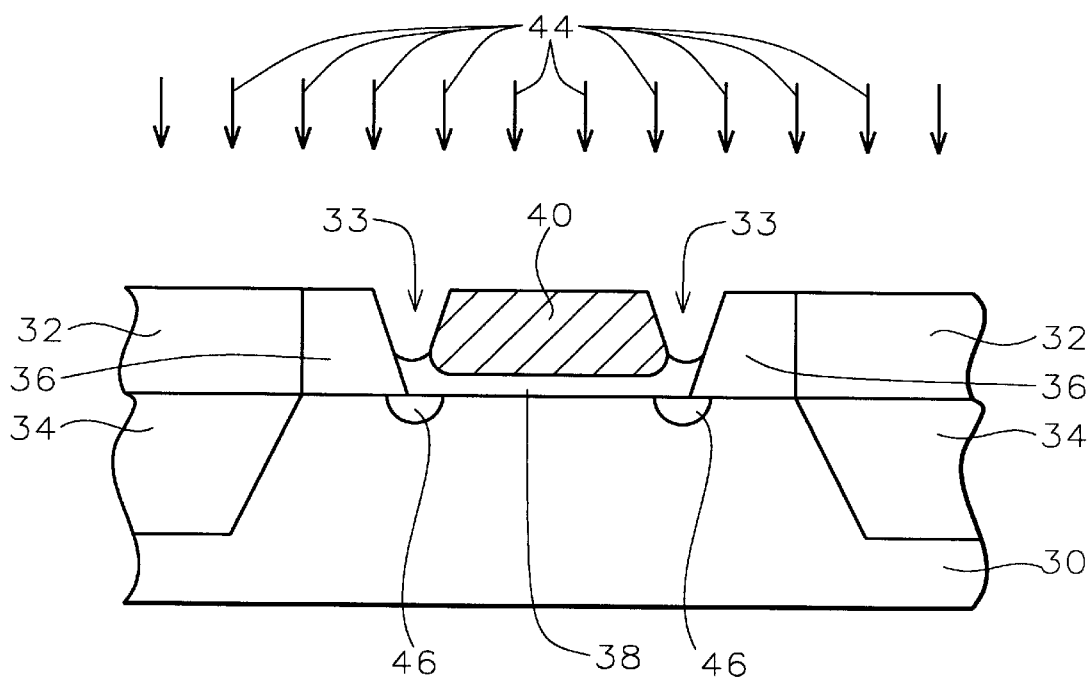

Referring now to FIG. 7, a majority of the second oxide layer 39 is stripped away using a wet etch leaving gate oxide 38 along the bottom edges and under the polysilicon gate 40. This step forms a V-shaped trench 33 between the intrinsic silicon regions 36 and the polysilicon gate 40. The trenches have a width at the top of between about 300 to 1000 Angstroms, and a depth less than the thickness of the polysilicon gate. A low-angle ($\leq 5°$) implantation 44 of one ion from a group comprising Boron, Phosphorous, Arsenic, $BF_2$, or Indium at a dose of between about 5E13 to 3E15 atoms/$cm^2$ and energy between about 0.5 to 180 keV is performed creating the LDD source/drain regions 46.

Figure 8:
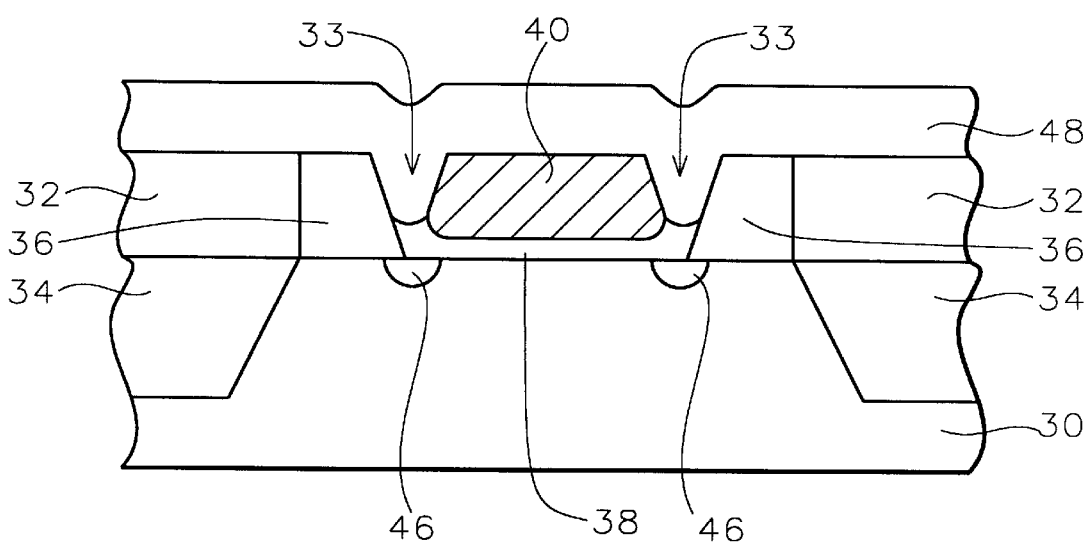

Referring now to FIG. 8, a third oxide layer 48 of thickness between about 2500 to 8000 Angstroms is deposited filling the V-shaped trench 33 and covering the surface of the structure.

Figure 9:
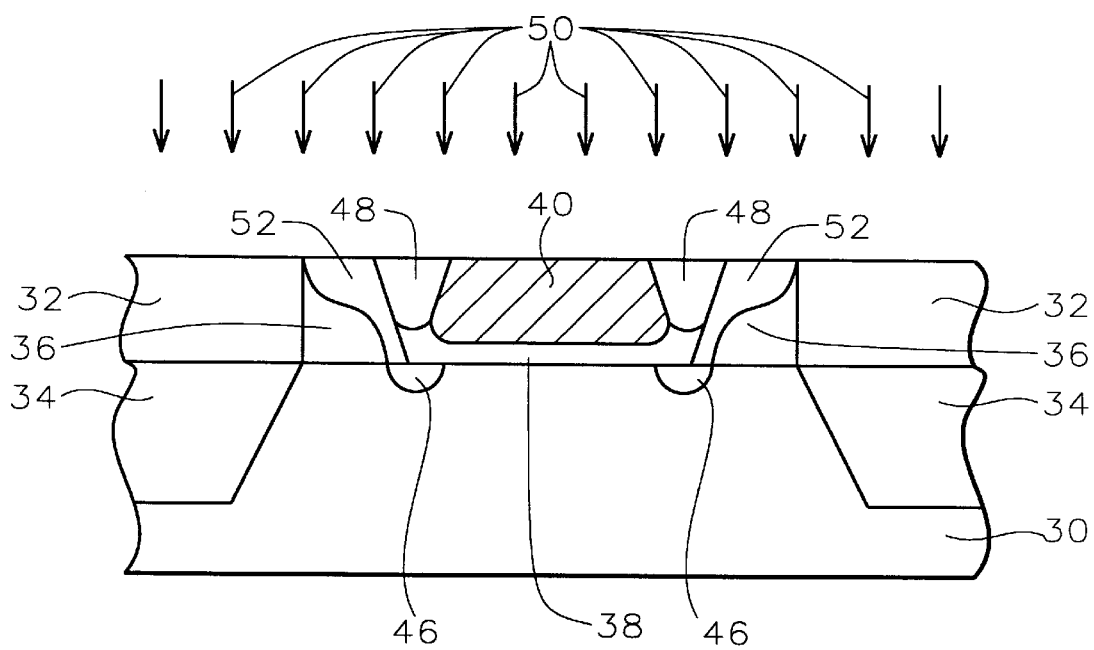

Referring now to FIG. 9, a CMP planarization is performed to expose the top surfaces of the polysilicon gate 40 and intrinsic silicon regions 36. This is followed by an ion implantation 50 of one ion species from a group comprising Boron, Phosphorous, Arsenic, or $BF_2$. The implantation 50 is performed at a dose of between about 1E15 to 1E16 atoms/$cm^2$ and energy between about 5 to 180 keV, thereby doping the polysilicon gate 40 and creating doped silicon source/drain regions 52 in intrinsic silicon regions 36.

Figure 10:
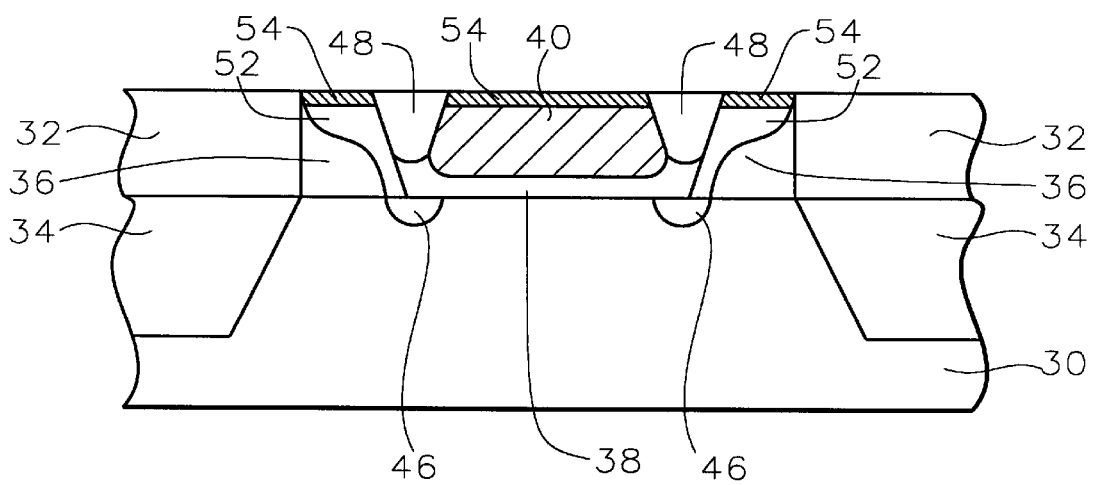

Referring now to FIG. 10, a metal layer, such as titanium, cobalt, nickel or composite layer of titanium overlying cobalt is deposited overlying the entire surface of the wafer. An annealing step then transforms the areas over both the silicon regions 52 and the polysilicon gate 40 to a metal silicide 54. Thereafter, the non-transformed metal overlying the oxide regions 32 and 48 is removed.

In accordance with the objects of this invention, a new method of fabricating a sub-quarter-micron MOSFET device having lightly doped source/drain (LDD) is described. The method provided uses self-aligning structures simplifying the manufacturing process and providing for consistent physical dimensions and electrical device characteristics. By minimizing the area of the active source/drain extensions covered by the source drain contacts, source/drain punch-through will occur at a significantly higher voltage. In addition, implanting into the V-shaped groove allows better control of the source/drain extension implant. Since the active gate area in the substrate is protected by oxide in the V-shaped grooves between the gate electrode and source/drain regions, the effects of particle implant damage during the one-step polysilicon and source/drain implantation are minimized. The additional spacing between electrodes allows for a thicker salicide with lower sheet resistance while minimizing inter-electrode leakage. Finally, the flat surface topology allows for better step coverage during subsequent metalization steps.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing an active area in a semiconductor substrate separated from other active areas by isolation regions;

forming a first oxide layer overlying said semiconductor substrate and said isolation regions;

patterning and etching away said first oxide layer in two distinct areas and within said active area to form two openings to said semiconductor substrate;

growing intrinsic silicon regions to fill each of said openings;

etching away said first oxide layer in said active area between said intrinsic silicon regions forming a gate opening to said semiconductor substrate;

conformally depositing a gate oxide layer within said gate opening and overlying said oxide layer and said intrinsic silicon regions;

depositing a conducting layer overlying said gate oxide and filling said gate opening;

planarizing said conducting layer to form a gate electrode within said gate opening;

growing a second oxide layer whereby portions of said conducting layer and said intrinsic regions are consumed such that more of said consumption occurs near the upper surfaces of said conducting layer and said intrinsic regions than in the lower portions;

etching away said second oxide layer and a portion of said first oxide layer and said gate oxide layer thus forming a V-shaped trench between said conducting layer and said intrinsic regions;

implanting first dopant ions into said substrate under said V-shaped trench to form source/drain extensions;

depositing a third oxide layer filling said V-shaped trench and overlying said conducting layer and said intrinsic regions;

implanting second dopant ions into said gate electrode and into said intrinsic regions to form source/drain regions; and siliciding said gate electrode and said source/drain regions completing fabrication of said integrated circuit device.

2. The method according to claim 1 wherein said isolation regions are formed by shallow trench isolation (STI).

3. The method according to claim 1 wherein said first oxide layer is deposited by low pressure chemical vapor deposition (LPCVD) or furnace oxidation at a thickness of between about 1000 to 3000 Angstroms.

4. The method according to claim 1 wherein said second oxide layer is grown by dry oxidation at a temperature of between about 800° C. to 1000° C. for a period of between about three to 120 minutes to a thickness of between about 400 to 1000 Angstroms.

5. The method according to claim 1 wherein said third oxide layer is deposited by low pressure chemical vapor deposition (LPCVD) or furnace oxidation at a thickness of between about 2500 to 8000 Angstroms.

6. The method according to claim 1 wherein said gate oxide layer is formed using rapid thermal oxidation (RTO), low pressure chemical vapor deposition (LPCVD) or furnace oxidation with a thickness of between about 10 to 200 Angstroms.

7. The method according to claim 1 wherein said growing of said intrinsic silicon region is performed using selective epitaxial growth (SEG).

8. The method according to claim 1 wherein said first dopant ions are implanted at an angle less than five degrees from perpendicular at a dose of between about 5E13 to 3E15 atoms/cm$^2$ at an energy of between about 0.5 to 180 keV.

9. The method according to claim 1 wherein said conducting layer is polysilicon deposited using low pressure chemical vapor deposition (LPCVD) or furnace oxidation with a thickness of between about 1000 to 3000 Angstroms.

10. The method according to claim 1 wherein said conducting layer is polysilicon germanium deposited using low pressure chemical vapor deposition (LPCVD), furnace oxidation or epitaxy with a thickness of between about 1000 to 3000 Angstroms.

11. The method according to claim 1 wherein said V-shaped trench has an upper width of between about 300 to 1000 Angstroms.

12. A method of fabricating an integrated circuit device comprising:

providing an active area in a semiconductor substrate separated from other active areas by isolation regions;

forming a first oxide layer overlying said semiconductor substrate and said isolation regions;

patterning and etching away said first oxide layer in two distinct areas and within said active area to form two openings to said semiconductor substrate;

growing intrinsic silicon regions to fill each of said openings;

etching away said first oxide layer in said active area between said intrinsic silicon regions forming a gate opening to said semiconductor substrate;

conformally depositing a gate oxide layer within said gate opening and overlying said oxide layer and said intrinsic silicon regions;

depositing a polysilicon layer overlying said gate oxide and filling said gate opening;

planarizing said polysilicon layer to form a gate electrode within said gate opening;

growing a second oxide layer by dry oxidation at a temperature of between about 800° C. to 1000° C. for a period of between about three to 120 minutes to a thickness of between about 400 to 1000 Angstroms whereby portions of said conducting layer and said intrinsic regions are consumed such that more of said consumption occurs near the upper surfaces of said polysilicon layer and said intrinsic regions than in the lower portions;

etching away said second oxide layer and a portion of said first oxide layer and said gate oxide layer thus forming a V-shaped trench between said polysilicon layer and said intrinsic regions;

implanting first dopant ions into said substrate under said V-shaped trench to form source/drain extensions;

depositing a third oxide layer filling said V-shaped trench and overlying said polysilicon layer and said intrinsic regions;

implanting second dopant ions into said gate electrode and into said intrinsic regions to form source/drain regions; and siliciding said gate electrode and said source/drain regions completing fabrication of said integrated circuit device.

13. The method according to claim 12 wherein said isolation regions are formed by shallow trench isolation (STI).

14. The method according to claim 12 wherein said first oxide layer is deposited by low pressure chemical vapor deposition (LPCVD) or furnace oxidation at a thickness of between about 1000 to 3000 Angstroms.

15. The method according to claim 12 wherein said third oxide layer is deposited by low pressure chemical vapor deposition (LPCVD) or furnace oxidation at a thickness of between about 2500 to 8000 Angstroms.

16. The method according to claim 12 wherein said gate oxide layer is formed using rapid thermal oxidation (RTO), low pressure chemical vapor deposition (LPCVD) or furnace oxidation with a thickness of between about 10 to 200 Angstroms.

17. The method according to claim 12 wherein said growing of said intrinsic silicon region is performed using selective epitaxial growth (SEG).

18. The method according to claim 12 wherein said first dopant ions are implanted at an angle less than five degrees from perpendicular at a dose of between about 5E13 to 3E15 atoms/cm$^2$ at an energy of between about 0.5 to 180 keV.

19. The method according to claim 12 wherein said polysilicon layer is deposited using low pressure chemical vapor deposition (LPCVD) or furnace oxidation with a thickness of between about 1000 to 3000 Angstroms.

20. The method according to claim 12 wherein said V-shaped trench has an upper width of between about 300 to 1000 Angstroms.

21. A method of fabricating an integrated circuit device comprising:

providing an active area in a semiconductor substrate separated from other active areas by isolation regions;

forming a first oxide layer overlying said semiconductor substrate and said isolation regions;

patterning and etching away said first oxide layer in two distinct areas and within said active area to form two openings to said semiconductor substrate;

growing intrinsic silicon regions to fill each of said openings;

etching away said first oxide layer in said active area between said intrinsic silicon regions forming a gate opening to said semiconductor substrate;

conformally depositing a gate oxide layer within said gate opening and overlying said oxide layer and said intrinsic silicon regions;

depositing a polysilicon layer overlying said gate oxide and filling said gate opening;

planarizing said polysilicon layer to form a gate electrode within said gate opening;

growing a second oxide layer whereby portions of said conducting layer and said intrinsic regions are consumed such that more of said consumption occurs near the upper surfaces of said polysilicon layer and said intrinsic regions than in the lower portions;

etching away said second oxide layer and a portion of said first oxide layer and said gate oxide layer thus forming a V-shaped trench having an upper width of between about 300 to 1000 Angstroms between said polysilicon layer and said intrinsic regions;

implanting first dopant ions into said substrate under said V-shaped trench to form source/drain extensions;

depositing a third oxide layer filling said V-shaped trench and overlying said polysilicon layer and said intrinsic regions;

implanting second dopant ions into said gate electrode and into said intrinsic regions to form source/drain regions; and siliciding said gate electrode and said source/drain regions completing fabrication of said integrated circuit device.

22. The method according to claim 21 wherein said isolation regions are formed by shallow trench isolation (STI).

23. The method according to claim 21 wherein said first oxide layer is deposited by low pressure chemical vapor deposition (LPCVD) or furnace oxidation at a thickness of between about 1000 to 3000 Angstroms.

24. The method according to claim 21 wherein said second oxide layer is grown by dry oxidation at a temperature of between about 800° C. to 1000° C. for a period of between about three to 120 minutes to a thickness of between about 400 to 1000 Angstroms.

25. The method according to claim 21 wherein said third oxide layer is deposited by low pressure chemical vapor deposition (LPCVD) or furnace oxidation at a thickness of between about 2500 to 8000 Angstroms.

26. The method according to claim 21 wherein said gate oxide layer is formed using rapid thermal oxidation (RTO), low pressure chemical vapor deposition (LPCVD) or furnace oxidation with a thickness of between about 10 to 200 Angstroms.

27. The method according to claim 21 wherein said growing of said intrinsic silicon region is performed using selective epitaxial growth (SEG).

28. The method according to claim 21 wherein said first dopant ions are implanted at an angle less than five degrees from perpendicular at a dose of between about 5E13 to 3E15 atoms/cm$^2$ at an energy of between about 0.5 to 180 keV.

29. The method according to claim 21 wherein said polysilicon layer is deposited low pressure chemical vapor deposition (LPCVD) or furnace oxidation with a thickness of between about 1000 to 3000 Angstroms.

* * * * *